US011387800B1

(12) United States Patent
Chang

(10) Patent No.: US 11,387,800 B1
(45) Date of Patent: Jul. 12, 2022

(54) METHOD FOR DYNAMICALLY ADJUSTING WEIGHTING VALUES TO EQUALIZE INPUT SIGNAL TO GENERATE EQUALIZER OUTPUT SIGNAL AND ASSOCIATED PARAMETRIC EQUALIZER

(71) Applicant: Elite Semiconductor Microelectronics Technology Inc., Hsinchu (TW)

(72) Inventor: Jung-Kuei Chang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/319,084

(22) Filed: May 12, 2021

(51) Int. Cl.
*H03G 5/16* (2006.01)
*G10L 25/21* (2013.01)
*H04R 3/00* (2006.01)
*H03G 5/02* (2006.01)

(52) U.S. Cl.
CPC ............ *H03G 5/165* (2013.01); *G10L 25/21* (2013.01); *H03G 5/025* (2013.01); *H04R 3/00* (2013.01)

(58) Field of Classification Search
CPC ........ H03G 5/025; H03G 5/165; G10L 25/21; H04R 3/00
USPC ................ 381/103; 333/28 R; 375/229, 230; 708/323
See application file for complete search history.

(56) References Cited

U.S. PATENT DOCUMENTS

| 4,456,893 | A | * | 6/1984 | Otani | H04L 27/01 375/230 |
| 5,682,125 | A | * | 10/1997 | Minuhin | G11B 20/10009 333/28 R |
| 8,351,493 | B2 | * | 1/2013 | Shakiba | H03H 21/0012 330/288 |
| 10,340,869 | B2 | * | 7/2019 | Seefeldt | G10L 19/008 |
| 2006/0114979 | A1 | * | 6/2006 | Pedersen | H03G 5/025 375/229 |
| 2007/0201545 | A1 | * | 8/2007 | Zamir | H04L 25/06 375/229 |
| 2019/0020965 | A1 | * | 1/2019 | Chen | H04R 1/1041 |

* cited by examiner

*Primary Examiner* — Xu Mei
(74) *Attorney, Agent, or Firm* — Winston Hsu

(57) ABSTRACT

A parametric equalizer includes a first parametric equalizer circuit, a second parametric equalizer circuit, a first multiplication circuit, a second multiplication circuit, an addition circuit, and a weighting control circuit. The first parametric equalizer circuit processes an input signal to output a first output signal. The second parametric equalizer circuit processes the input signal to output a second output signal. The first multiplication circuit multiplies the first output signal and a first weighting value to generate a first adjusted output signal. The second multiplication circuit multiplies the second output signal and a second weighting value to generate a second adjusted output signal. The addition circuit combines the first adjusted output signal and the second adjusted output signal to generate an equalizer output signal. The weighting control circuit dynamically adjusts the first weighting value and the second weighting value according to the equalizer output signal.

26 Claims, 12 Drawing Sheets

METHOD FOR DYNAMICALLY ADJUSTING WEIGHTING VALUES TO EQUALIZE INPUT SIGNAL TO GENERATE EQUALIZER OUTPUT SIGNAL AND ASSOCIATED PARAMETRIC EQUALIZER

BACKGROUND OF THE INVENTION

1. Field of the Invention

The present invention is related to an equalizer design, and more particularly, to a method for dynamically adjusting weighting values to equalize an input signal to generate an equalizer output signal and associated parametric equalizer.

2. Description of the Prior Art

Parametric equalizer is an equalizer that may configure parameters such as a center frequency and a quality factor (Q), to perform an output frequency response modulation on an input signal. By using the parametric equalizer, when the level of the signal inputted to the parametric equalizer is too large, clipping of the signal may not occur. However, when the level of the signal inputted to the parametric equalizer is too small, good auditory effect may not be achieved by using the parametric equalizer. In addition, gain compensation may be lost when the level of the signal inputted to the parametric equalizer is too large. As a result, for addressing the above-mentioned problems, a method for compensating the output frequency response regarding the level of the input signal and an associated parametric equalizer are urgently needed.

SUMMARY OF THE INVENTION

It is therefore an objective of the present invention to provide a method for dynamically adjusting weighting values to equalize an input signal to generate an equalizer output signal and associated parametric equalizer, in order to solve the above-mentioned problems.

According to an embodiment of the present invention, a parametric equalizer is provided. Instead of adjusting the gain values of the parametric equalizer, the parametric equalizer dynamically adjusts weighting values according to an equalizer output signal. The parametric equalizer comprises a first parametric equalizer circuit, a second parametric equalizer circuit, a first multiplication circuit, a second multiplication circuit, an addition circuit, and a weighting control circuit. The first parametric equalizer circuit has a first transfer function with a positive gain, and is arranged to process an input signal according to the first transfer function and output a first output signal by processing the input signal. The second parametric equalizer circuit has a second transfer function with a negative gain, and is arranged to process the input signal according to the second transfer function and output a second output signal by processing the input signal. The first multiplication circuit is coupled to the first parametric equalizer circuit, and arranged to multiply the first output signal and a first weighting value to generate a first adjusted output signal. The second multiplication circuit is coupled to the second parametric equalizer circuit, and arranged to multiply the second output signal and a second weighting value to generate a second adjusted output signal. The addition circuit is coupled to the first multiplication circuit and the second multiplication circuit, and arranged to combine the first adjusted output signal and the second adjusted output signal to generate an equalizer output signal. The weighting control circuit is coupled to the first multiplication circuit, the second multiplication circuit, and the addition circuit, and arranged to dynamically adjust the first weighting value and the second weighting value according to the equalizer output signal.

According to an embodiment of the present invention, a method for dynamically adjusting weighting values to equalize an input signal to generate an equalizer output signal is provided. The method includes: processing, by a first parametric equalizer circuit having a first transfer function with a positive gain, the input signal to generate and output a first output signal; processing, by a second parametric equalizer circuit having a second transfer function with a negative gain, the input signal to generate and output a second output signal; multiplying the first output signal and a first weighting value to generate a first adjusted output signal; multiplying the second output signal and a second weighting value to generate a second adjusted output signal; combining the first adjusted output signal and the second adjusted output signal to generate the equalizer output signal; and dynamically adjusting the first weighting value and the second weighting value according to the equalizer output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
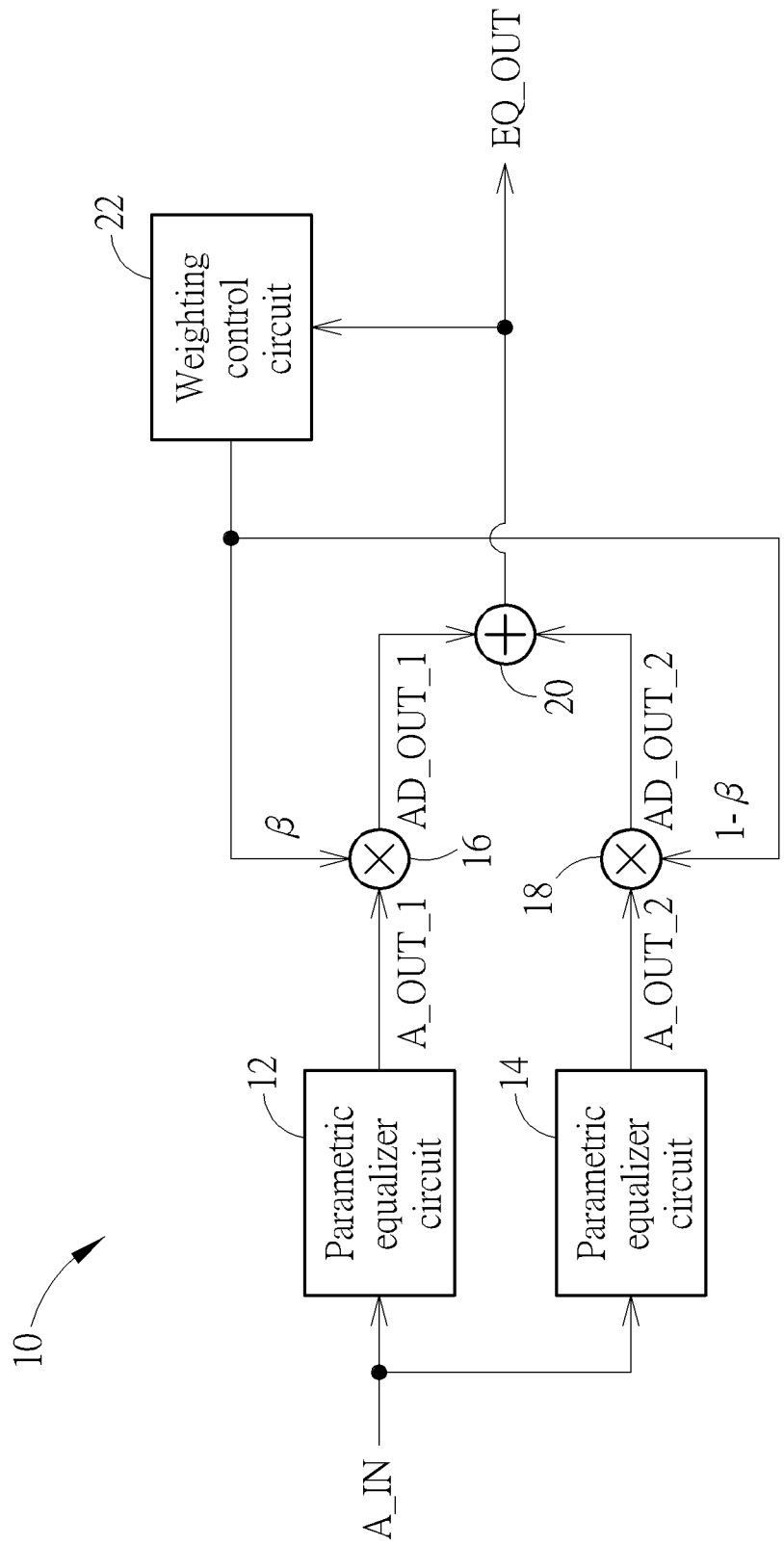
FIG. 1 is a diagram illustrating a parametric equalizer according to an embodiment of the present invention.

FIG. 1 is a diagram illustrating a parametric equalizer 10 according to an embodiment of the present invention. Instead of adjusting gain values, the parametric equalizer 10 dynamically adjusts weighting values according to an equalizer output signal. For example, the weighting values include a first weighting value and a second weighting value, and a sum of the first weighting value and the second weighting value is equal to one. For brevity, the first weighting value and the second weighting value are labeled as "$\beta$" and "1-$\beta$", respectively.

The parametric equalizer 10 receives an input signal A_IN such as an audio signal, and equalizes the input signal A_IN to generate an equalizer output signal EQ_OUT. As shown in FIG. 1, the parametric equalizer 10 comprises a plurality of parametric equalizer circuits 12 and 14, a multiplication circuit 16, a multiplication circuit 18, an addition circuit 20, and a weighting control circuit 22. The parametric equalizer circuit 12 has a transfer function $H_1$ with a positive gain $G_1$ ($G_1 > 0$), and is arranged to process the input signal A_IN according to the transfer function $H_1$ and output a first output signal A_OUT_1 by processing the input signal A_IN. The parametric equalizer circuit 14 has a transfer function $H_2$ with a negative gain $G_2$ ($G_2 < 0$), and is arranged to process the input signal A_IN according to the transfer function $H_2$ and output a second output signal A_OUT_2 by processing the input signal A_IN, wherein a center frequency of the parametric equalizer circuit 12 is equal to the center frequency of the parametric equalizer circuit 14. The multiplication circuit 16 is coupled to the parametric equalizer circuit 12, and is arranged to multiply the first output signal A_OUT_1 and the first weighting value $\beta$ to generate a first adjusted output signal AD_OUT_1 (i.e. AD_OUT_1=A_OUT_1*$\beta$). The multiplication circuit 18 is coupled to the parametric equalizer circuit 14, and is arranged to multiply the second output signal A_OUT_2 and the second weighting value 1-$\beta$ to generate a second adjusted output signal AD_OUT_2 (i.e. AD_OUT_2=A_OUT_2*(1-$\beta$)). The addition circuit 20 is coupled to the multiplication circuits 16 and 18, and is arranged to combine the first adjusted output signal AD_OUT_1 and the second adjusted output signal AD_OUT_2 to generate the equalizer output signal EQ_OUT (i.e. EQ_OUT=AD_OUT_1+AD_OUT_2). The weighting control circuit 22 is coupled to the multiplication circuits 16 and 18 and the addition circuit 20, and is arranged to dynamically adjust the first weighting value $\beta$ and the second weighting value 1-$\beta$ according to the equalizer output signal EQ_OUT.

In addition, the parametric equalizer circuit 12 can be a peaking filter embodied by a biquad filter, and the parametric equalizer circuit 14 can be a notch filter embodied by a biquad filter, but the present invention is not limited thereto. For example, when the parametric equalizer circuit 12 or the parametric equalizer circuit 14 is embodied by a biquad filter, the transfer function of the parametric equalizer circuit 12 or the parametric equalizer circuit 14 is represented by an equation as below:

$$H(z) = \frac{b_0 + b_1 z^{-1} + b_2 z^{-2}}{1 + a_1 z^{-1} + a_2 z^{-2}}$$

wherein the coefficients $b_0$, $b_1$, $b_2$, $a_1$, $a_2$ can be determined by the following matlab codes:

```
K=tan((pi*fc)/fs);
V0=10^(G/20);
if (V0<1) % invert gain if a cut
    V0=1/V0;
end
if (G>0)
    b0=(1+(V0/Q)*K+K^2)/(1+((1/Q)*K)+K^2);
    b1=(2*(K^2-1))/(1+((1/Q)*K)+K^2);
    b2=(1-(V0/Q)*K)+K^2)/(1+((1/Q)*K)+K^2);
    a1=b1;
    a2=(1-(1/Q)*K)+K^2)/(1+((1/Q)*K)+K^2);
else
    b0=(1+(1/Q)*K+K^2)/(1+((V0/Q)*K)+K^2);
    b1=(2*(K^2-1))/(1+((V0/Q)*K)+K^2);
    b2=(1-(1/Q)*K)+K^2)/(1+((V0/Q)*K)+K^2);
    a1=b1;
    a2=(1-(V0/Q)*K)+K^2)/(1+((V0/Q)*K)+K^2);
end
```

In above matlab codes, fc is the center frequency, fs is the sampling rate, G is the logarithmic gain in dB, and Q is the quality factor.

For example, the parametric equalizer circuit 12 is a peaking filter having +12 dB gain (i.e. $G_1$=+12 dB) and a quality factor $Q_P$ embodied by a biquad filter, and the parametric equalizer circuit 14 is a notch filter having −6 dB gain (i.e. $G_2$=−6 dB) and a quality factor $Q_N$ embodied by a biquad filter, but the present invention is not limited thereto. By the above-mentioned equation and matlab codes, the transfer function $H_1$ and the transfer function $H_2$ can be determined. Then, a weighting value combination of the transfer function $H_1$ and the transfer function $H_2$ is used to reach different gain values, which is expressed as follows:

$$\beta \times H_1 + (1-\beta) \times H_2 =$$

$$\beta \times \frac{\left(1 + \frac{4}{Q_P}K + K^2\right) + 2(K^2-1)Z^{-1} + \left(1 - \frac{4}{Q_P}K + K^2\right)Z^{-2}}{\left(1 + \frac{1}{Q_P}K + K^2\right) + 2(K^2-1)Z^{-1} + \left(1 - \frac{1}{Q_P}K + K^2\right)Z^{-2}} +$$

$$(1-\beta) \times \frac{\left(1 + \frac{1}{Q_N}K + K^2\right) + 2(K^2-1)Z^{-1} + \left(1 - \frac{1}{Q_N}K + K^2\right)Z^{-2}}{\left(1 + \frac{2}{Q_N}K + K^2\right) + 2(K^2-1)Z^{-1} + \left(1 - \frac{2}{Q_N}K + K^2\right)Z^{-2}}$$

In order to reduce the above two fractions to a common denominator, it is assumed that $Q_N=2Q_P$, thereby obtaining the following fraction:

$$\beta \times H_1 + (1-\beta) \times H_2 =$$

$$\frac{\left\{1 + \left[4\beta + \frac{(1-\beta)}{2}\right]\frac{K}{Q_P} + K^2\right\} +}{\left(1 + \frac{1}{Q_P}K + K^2\right) + 2(K^2-1)Z^{-1} + \left(1 - \frac{1}{Q_P}K + K^2\right)Z^{-2}}$$

wherein $$4\beta + \frac{1-\beta}{2}$$

is a new linear gain. When $\beta$ is equal to 1, the parametric equalizer 10 can be regarded as a peaking filter that is implemented by the parametric equalizer circuit 12. When $\beta$ is equal to 0, the parametric equalizer 10 can be regarded as a notch filter that is implemented by the parametric equalizer circuit 14. In addition, the relationship of the quality factor $Q_P$ and the quality factor $Q_N$ (e.g. $Q_N=2Q_P$) required for the weighting value combination can be determined by reducing the two fractions to a common denominator in the calculation. Therefore, the parametric equalizer 10 can reach different gain values between +12 dB and −6 dB by the weighting value combination of the transfer function $H_1$ and the transfer function $H_2$, wherein a ratio of the quality factor $Q_N$ to the quality factor $Q_P$ is a pre-defined constant (e.g. $Q_N=2Q_P$). Since the parametric equalizer 10 only applies two parametric equalizer circuits 12, 14 and the weighting value (i.e. the first weighting value $\beta$ and the second weighting value 1-$\beta$) combination, the hardware cost of the present invention is not high and the present invention is easy to configure. In addition, the parametric equalizer circuits 12, 14 may be embodied by biquad filters that are programmable. Hence, when two parametric equalizer circuits 12, 14 are not in use, the two parametric equalizer circuits 12, 14 can be reused for other purposes.

Figure 2:
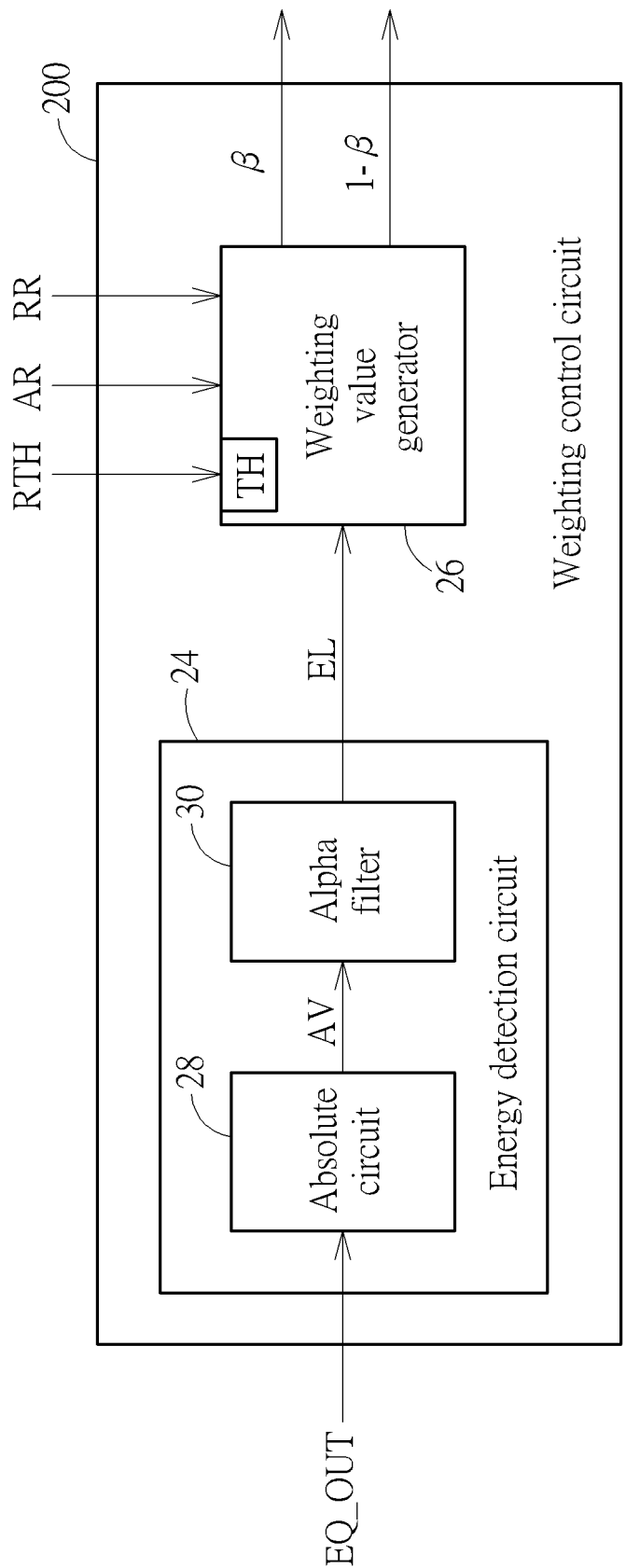
FIG. 2 is a diagram illustrating a weighting control circuit according to an embodiment of the present invention.

FIG. 2 is a diagram illustrating a weighting control circuit 200 according to an embodiment of the present invention. The weighting control circuit 22 in the parametric equalizer 10 shown in FIG. 1 may be implemented using the weighting control circuit 200 shown in FIG. 2. As shown in FIG. 2, the weighting control circuit 200 comprises an energy detection circuit 24 and a weighting value generator 26. The energy detection circuit 24 is arranged to measure an energy level EL of the equalizer output signal EQ_OUT. The weighting value generator 26 is coupled to the energy detection circuit 24, and is arranged to dynamically adjust the first weighting value $\beta$ and the second weighting value 1-$\beta$ according to the energy level EL of the equalizer output signal EQ_OUT. In this embodiment, the energy detection circuit 24 comprises an absolute circuit 28 and an alpha filter 30. The absolute circuit 28 is arranged to generate an absolute value AV of the equalizer output signal EQ_OUT by performing absolute value computation upon the equalizer output signal EQ_OUT. The alpha filter 30 is coupled to the absolute circuit 28 and the weighting value generator 26, and is arranged to generate the energy level EL according to the absolute value computation result (i.e. absolute value AV) and transmit the energy level EL to the weighting value generator 26. For example, the alpha filter 30 can be a $2^{nd}$ order alpha filter, and the coefficients of the $2^{nd}$ order alpha filter are 2's power (i.e. $\frac{1}{128}$, $\frac{1}{256}$, $\frac{1}{512}$, ... etc.), but the present invention is not limited thereto.

For directly controlling the weighting value (e.g. one of the first weighting value $\beta$ and the second weighting value 1-$\beta$; for better comprehension, controlling the first weighting value with slope adjustment to dynamically adjust the first weighting value $\beta$ and the second weighting value 1-$\beta$ according to the energy level EL of the equalizer output signal EQ_OUT, an attack control and a release control are adopted in the weighting value generator 26, wherein the release control is arranged to release the equalizer output signal EQ_OUT when the energy level EL is smaller than a threshold value TH, and the attack control is arranged to suppress the equalizer output signal EQ_OUT when the energy level EL is not smaller than the threshold value TH. Therefore, the weighting value generator 26 is further arranged to receive a reference threshold value RTH, an attack rate setting AR and a release rate setting RR. The threshold value TH internally used by the weighting value generator 26 is obtained by multiplying the reference threshold RTH and a pre-determined coefficient (e.g. TH=RTH*0.635, where 0.635 is the pre-determined coefficient). The attack rate setting AR may be larger than the release rate setting RR. After receiving the energy level EL from the alpha filter 30, the weighting value generator 26 compares the energy level EL with the threshold value TH. If the energy level EL is smaller than the threshold value TH (i.e. in a range of the release control), the weighting value generator 26 controls the first weighting value $\beta$ according to slope adjustment specified by the release rate setting RR; and if the energy level EL is not smaller than the threshold value TH (i.e. in a range of the attack control), the weighting value generator 26 controls the first weighting value $\beta$ according to slope adjustment specified by the attack rate setting AR. Instead of dynamically adjusting the gain values with linear to log transfer, the parametric equalizer 10 directly controls the first weighting value $\beta$ with slope adjustment to dynamically adjust the first weighting value $\beta$ and the second weighting value 1-$\beta$. It should be noted that the linear to log transfer is not needed in the process of dynamically adjusting the first weighting value $\beta$ and the second weighting value 1-$\beta$. In this way, the parametric equalizer 10 has the lower hardware cost.

In the release control (i.e. the energy level EL is smaller than the threshold value TH), 3 coefficients from largest to smallest $C_1$, $C_2$, $C_3$ (e.g. $C_1=0.666$, $C_2=0.43$, and $C_3=0.26$) are used to categorize the first weighting value $\beta$, and 4 fractions from largest to smallest $S_1$, $S_2$, $S_3$, $S_4$ (e.g.

$$S_1 = \frac{4}{2^{17}}, S_2 = \frac{3}{2^{17}}, S_3 = \frac{2}{2^{17}}, S_4 = \frac{1}{2^{17}}$$

are used to set the release rate setting RR for slope adjustment, but the present invention is not limited thereto. If the first weighting value $\beta$ is larger than or equal to $C_1$ (e.g. 0.666), the first weighting value $\beta$ is adjusted/updated by adding the fraction $S_1$ (e.g.

$$\frac{4}{2^{17}}$$

to the first weighting value $\beta$ (i.e. $\beta=\beta+S_1$); if the first weighting value $\beta$ is larger than or equal to $C_2$ (e.g. 0.43) and smaller than $C_1$ (e.g. 0.666), the first weighting value $\beta$ is adjusted/updated by adding the fraction $S_2$ (e.g.

$$\frac{3}{2^{17}}$$

to the first weighting value $\beta$ (i.e. $\beta=\beta+S_2$); if the first weighting value $\beta$ is larger than or equal to $C_3$ (e.g. 0.26) and smaller than $C_2$ (e.g. 0.43), the first weighting value $\beta$ is adjusted/updated by adding the fraction $S_3$ (e.g.

$$\frac{2}{2^{17}}$$

) to the first weighting value $\beta$ (i.e. $\beta=\beta+S_3$); and if the first weighting value $\beta$ is smaller than $C_3$ (e.g. 0.26), the first weighting value $\beta$ is adjusted/updated by adding the fraction $S_4$ (e.g.

$$\frac{1}{2^{17}}$$

) to the first weighting value $\beta$ (i.e. $\beta=\beta+S_4$).

In the attack control (i.e. the energy level EL is not smaller than the threshold value TH), 3 coefficients from largest to smallest $C_1$, $C_2$, $C_3$ (e.g. $C_1=0.666$, $C_2=0.43$, and $C_3=0.26$) are used to categorize the first weighting value $\beta$, and 4 fractions from largest to smallest $B_1$, $B_2$, $B_3$, $B_4$ $$\left(\text{e.g. } B_1 = \frac{4}{2^{12}}, B_2 = \frac{3}{2^{12}}, B_3 = \frac{2}{2^{12}}, B_4 = \frac{1}{2^{12}}\right)$$

are used to set the attack rate setting AR for slope adjustment, but the present invention is not limited thereto. If the first weighting value $\beta$ is larger than or equal to $C_1$ (e.g. 0.666), the first weighting value $\beta$ is adjusted/updated by subtracting the fraction $B_1$ $$\left(\text{e.g. } \frac{4}{2^{12}}\right)$$

from the first weighting value $\beta$ (i.e. $\beta=\beta-B_1$); if the first weighting value $\beta$ is larger than or equal to $C_2$ (e.g. 0.43) and smaller than $C_1$ (e.g. 0.666), the first weighting value $\beta$ is adjusted/updated by subtracting the fraction $B_2$ $$\left(\text{e.g. } \frac{3}{2^{12}}\right)$$

from the first weighting value $\beta$ (i.e. $\beta=\beta-B_2$); if the first weighting value $\beta$ is larger than or equal to $C_3$ (e.g. 0.26) and smaller than $C_2$ (e.g. 0.43), the first weighting value $\beta$ is adjusted/updated by subtracting the fraction $B_3$ $$\left(\text{e.g. } \frac{2}{2^{12}}\right)$$

from the first weighting value $\beta$ (i.e. $\beta=\beta-B_3$); and if the first weighting value $\beta$ is smaller than $C_3$ (e.g. 0.26), the first weighting value $\beta$ is adjusted/updated by subtracting the fraction $B_4$ $$\left(\text{e.g. } \frac{1}{2^{12}}\right)$$

from the first weighting value $\beta$ (i.e. $\beta=\beta-B_4$).

In the attack or release control, the purpose that the numerators of the fractions are from largest to smallest instead of being all the same (e.g. all of the numerators of the fractions is 1) is to make the entire control range of the first weighting value $\beta$ has a relatively linear rate control. In addition, the control speed of the first weighting value $\beta$ can be made uniform. For example, the release rate setting RR, including $S_1$, $S_2$, $S_3$, $S_4$, can be set as $$\frac{4}{2^{17}}, \frac{3}{2^{17}}, \frac{2}{2^{17}}, \frac{1}{2^{17}}$$

instead of $$\frac{1}{2^{17}}, \frac{1}{2^{17}}, \frac{1}{2^{17}}, \frac{1}{2^{17}};$$

the attack rate setting AR, including $B_1$, $B_2$, $B_3$, $B_4$, can be set as $$\frac{4}{2^{12}}, \frac{3}{2^{12}}, \frac{2}{2^{12}}, \frac{1}{2^{12}}$$

instead of $$\frac{1}{2^{12}}, \frac{1}{2^{12}}, \frac{1}{2^{12}}, \frac{1}{2^{12}}.$$

It should be noted that, in the present embodiment, the attack rate setting AR is usually larger than the release rate setting RR.

In the release control, the denominators of the 4 fractions $S_1$, $S_2$, $S_3$, $S_4$ $$\left(\text{e.g. } S_1 = \frac{4}{2^{17}}, S_2 = \frac{3}{2^{17}}, S_3 = \frac{2}{2^{17}}, S_4 = \frac{1}{2^{17}}\right)$$

and more particularly, the power terms of the denominators (e.g. the power term of 2 such as 17), are used to control the release rate. The larger is the power term of the denominator, the larger is the release rate. For example, the release rate when the power term of the denominator is 18 is greater than the release rate when the power term of the denominator is 16. Similarly, in the attack control, the power terms of the denominators of the 4 fractions $B_1$, $B_2$, $B_3$, $B_4$ $$\left(\text{e.g. } B_1 = \frac{4}{2^{12}}, B_2 = \frac{3}{2^{12}}, B_3 = \frac{2}{2^{12}}, B_4 = \frac{1}{2^{12}}\right)$$

may also be arranged to control the attack rate.

It should be noted that the weighting control circuit 200 is only one exemplary implementation of the weighting control circuit in the parametric equalizer 10. In practice, any circuit architecture that is capable of dynamically adjusting the first weighting value β and the second weighting value 1-β according to the equalizer output signal EQ_OUT may be employed by the weighting control circuit 22. These alternative designs all fall within the scope of the present invention.

Figure 3:
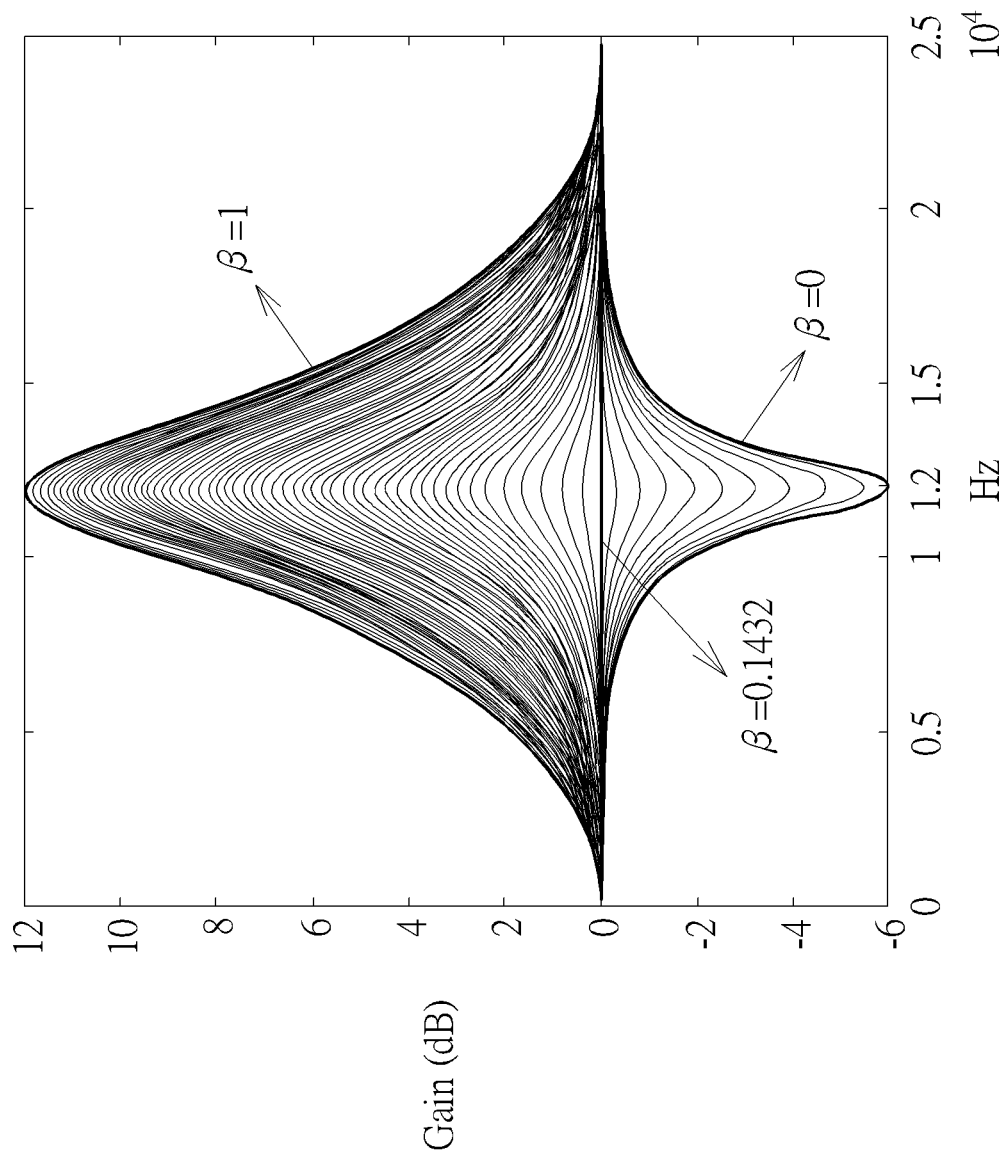
FIG. 3 is a diagram illustrating a parametric equalizer shown in FIG. 1 with different gain values set under different weighting value combinations according to an embodiment of the present invention.

FIG. 3 is a diagram illustrating the parametric equalizer 10 shown in FIG. 1 with different gain values set under different weighting value combinations according to an embodiment of the present invention. The parametric equalizer circuit 12 and the parametric equalizer circuit 14 are configured as a peaking filter having a transfer function $H_1$ with a positive gain +12 dB and a quality factor $Q_P$ and a notch filter having a transfer function $H_2$ with a negative gain -6 dB and a quality factor $Q_N$, respectively, and the center frequency $1.2 \times 10^4$ hertz (Hz) of the parametric equalizer circuit 12 is equal to the center frequency $1.2 \times 10^4$ Hz of the parametric equalizer circuit 14. By the above-mentioned weighting value combination of the transfer function $H_1$ and the transfer function $H_2$, any gain value between +12 dB to -6 dB can be reached for the parametric equalizer 10, wherein the ratio of the quality factor $Q_N$ to the quality factor $Q_P$ is a pre-defined constant (e.g. $Q_N=2Q_P$).

As shown in FIG. 3, 64 frequency response curves are obtained by directly controlling the weighting value (e.g. one of the first weighting value β and the second weighting value 1-β; for better comprehension, controlling the first weighting value with slope adjustment. The number of the frequency response curves can be determined based on the accuracy; as a result, 64 frequency response curves are for illustrative purposes only, and are not meant to be a limitation of the present invention. When β is equal to 1, the parametric equalizer 10 can be regarded as the peaking filter having a transfer function $H_1$ with a positive gain +12 dB (i.e. the top frequency response curve shown in FIG. 3); and when β is equal to 0, the parametric equalizer 10 can be regarded as the notch filter having a transfer function $H_2$ with a negative gain -6 dB (i.e. the bottom frequency response curve shown in FIG. 3). In addition, all response curves are smooth in FIG. 3, which cause less signal variation and less power variation when the parametric equalizer 10 is used.

Figure 4:
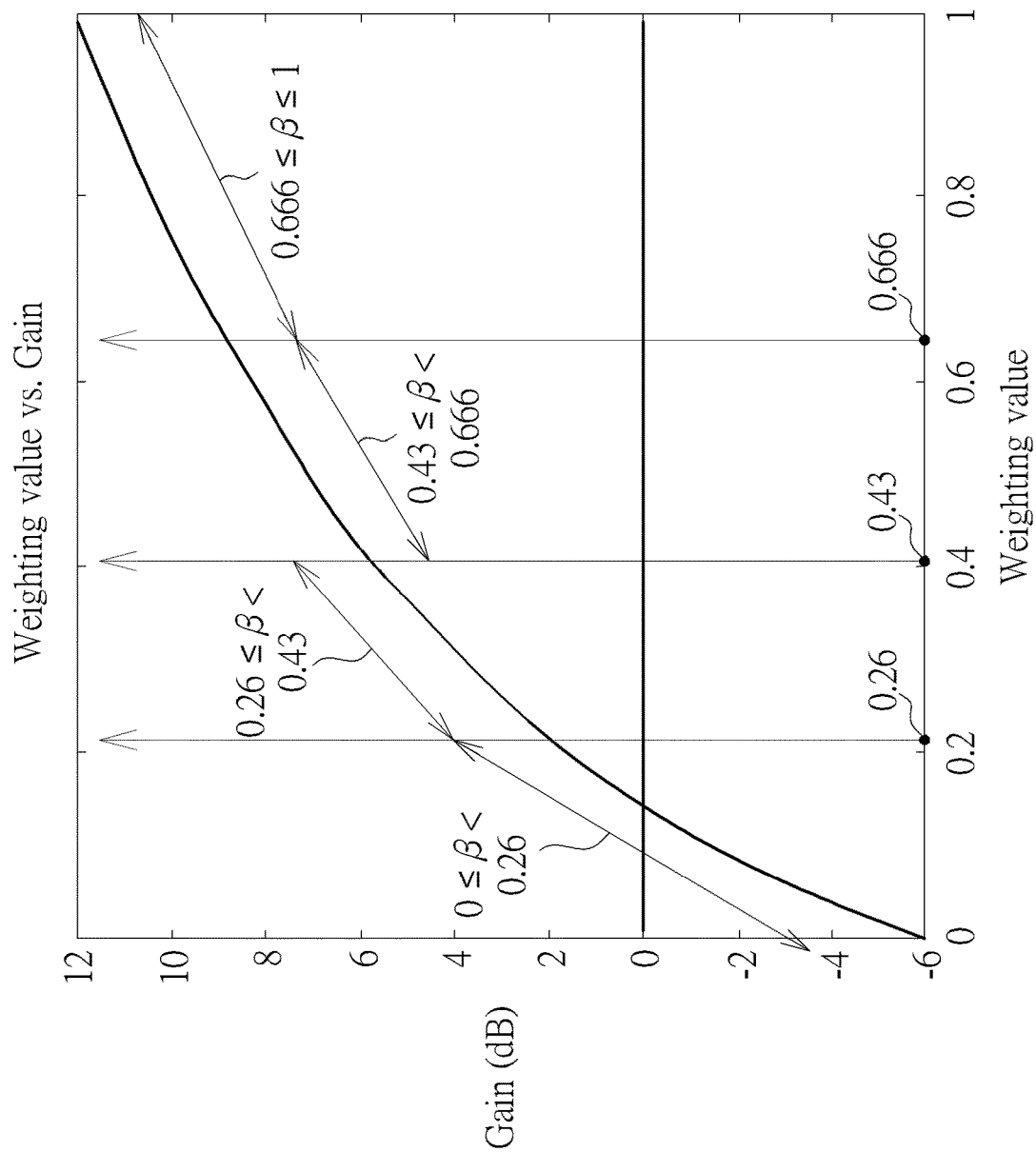
FIG. 4 is a diagram illustrating the relationship between a gain value reached by the parametric equalizer shown in FIG. 1 and a weighting value employed by the parametric equalizer shown in FIG. 1 according to an embodiment of the present invention.

FIG. 4 is a diagram illustrating the relationship between a gain value reached by the parametric equalizer 10 shown in FIG. 1 and a weighting value employed by the parametric equalizer 10 shown in FIG. 1 according to an embodiment of the present invention. Assume that the parametric equalizer circuit 12 and the parametric equalizer circuit 14 are configured as a peaking filter having a transfer function $H_1$ with a positive gain +12 dB and a quality factor $Q_P$ and a notch filter having a transfer function $H_2$ with a negative gain -6 dB and a quality factor $Q_N$, respectively, and the center frequency $1.2 \times 10^4$ Hz of the parametric equalizer circuit 12 is equal to the center frequency $1.2 \times 10^4$ Hz of the parametric equalizer circuit 14. By the above-mentioned weighting value combination of the transfer function $H_1$ and the transfer function $H_2$, any gain value between +12 dB to -6 dB can be reached for the parametric equalizer 10, wherein the ratio of the quality factor $Q_N$ to the quality factor $Q_P$ is a pre-defined constant (e.g. $Q_N=2Q_P$).

In the above-mentioned release control (or attack control), 4 fractions $$\frac{4}{2^{17}}, \frac{3}{2^{17}}, \frac{2}{2^{17}}, \frac{1}{2^{17}}$$

(or 4 fractions $$\left(\text{or 4 fractions } \frac{4}{2^{12}}, \frac{3}{2^{12}}, \frac{2}{2^{12}}, \frac{1}{2^{12}}\right)$$

) are used to set the release rate setting RR (or the attack rate setting AR) for slope adjustment in FIG. 4. In addition, 3 coefficients 0.666, 0.43, and 0.26 are used to categorize the weighting value (e.g. one of the first weighting value β and the second weighting value 1-β; for better comprehension, the first weighting value β). In this embodiment, four slope values are approximately obtained in four intervals (i.e. 0≤β<0.26, 0.26≤β<0.43, 0.43≤β<0.666, and 0.666≤β<1). Then, the numerators of the fractions are determined by magnitude of the four slope values. As shown in FIG. 4, by setting the numerators of the fractions of the release rate setting RR and the attack rate setting AR as 4 to 1 instead of all the same (e.g. all of the numerators of the fractions is 1), the curve representing the relationship between the gain values from +12 dB to -6 dB reached by the parametric equalizer 10 and the weighting value (e.g. the first weighting value can be smooth; as a result, the entire control range of the weighting value (e.g. the first weighting value has a relatively linear rate control. In addition, the control speed of the weighting value (e.g. the first weighting value can be made uniform.

Figure 5:
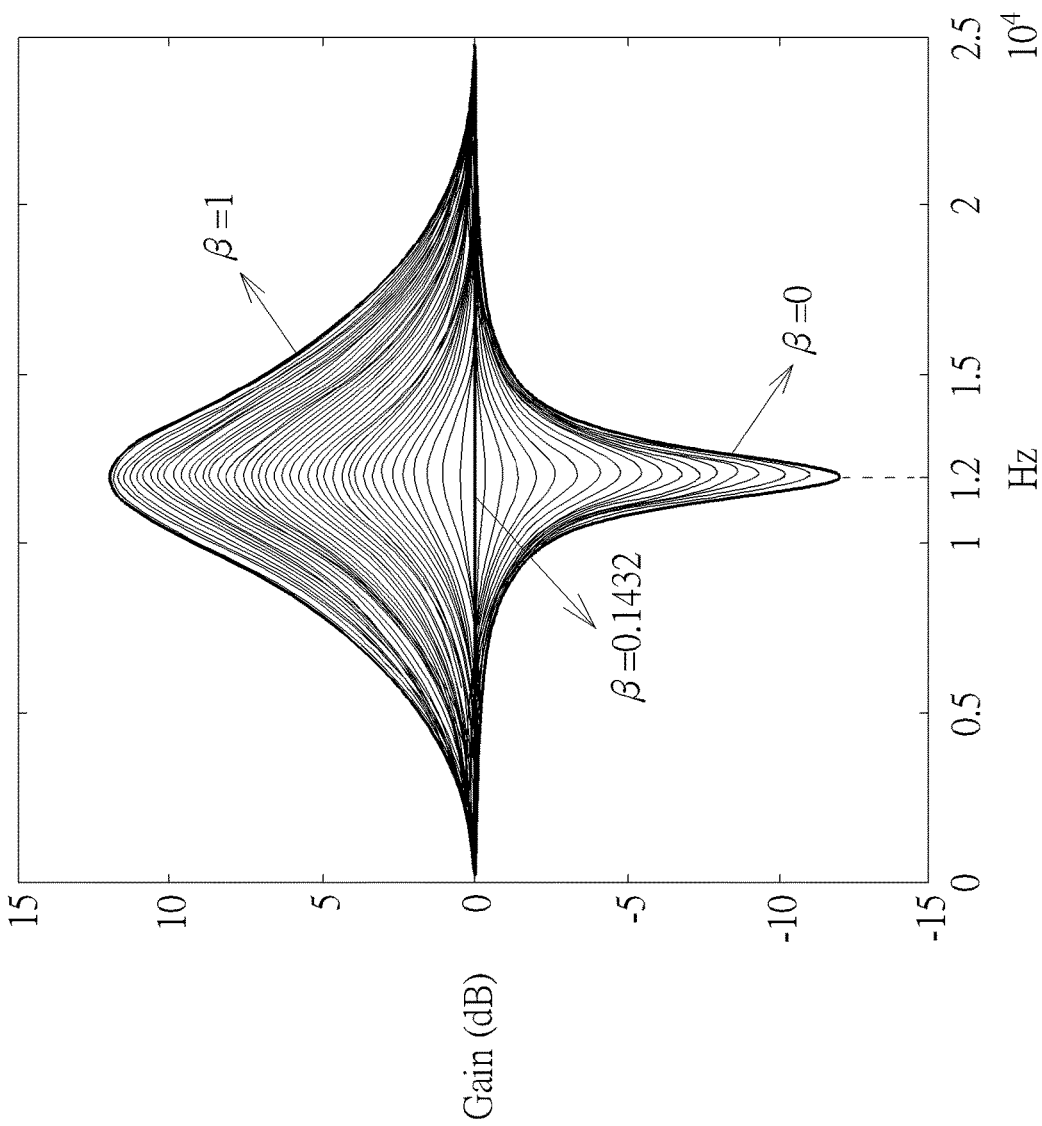
FIG. 5 is a diagram illustrating the parametric equalizer shown in FIG. 1 with different gain values set under different weighting value combinations according to another embodiment of the present invention.

FIG. 5 is a diagram illustrating the parametric equalizer 10 shown in FIG. 1 with different gain values set under different weighting value combinations according to another embodiment of the present invention. Assume that the parametric equalizer circuit 12 and the parametric equalizer circuit 14 are configured as a peaking filter having a transfer function $H_1$ with a positive gain +12 dB and a quality factor $Q_P$ and a notch filter having a transfer function $H_2$ with a negative gain -12 dB and a quality factor $Q_N$, respectively, and the center frequency $1.2 \times 10^4$ Hz of the parametric equalizer circuit 12 is equal to the center frequency $1.2 \times 10^4$ Hz of the parametric equalizer circuit 14. By the above-mentioned weighting combination of the transfer function $H_1$ and the transfer function $H_2$, any gain value between +12 dB to -12 dB can be reached for the parametric equalizer 10, wherein the ratio of the quality factor $Q_N$ to the quality factor $Q_P$ is a pre-defined constant (e.g. $Q_N=4Q_P$). For brevity, similar descriptions for this embodiment are not repeated in detail here.

As shown in FIG. 5, 64 frequency response curves are obtained by directly controlling the weighting value (e.g. one of the first weighting value β and the second weighting value 1-β; for better comprehension, the first weighting value β) with slope adjustment. The number of the frequency response curves can be determined based on the accuracy; as a result, 64 frequency response curves are for illustrative purposes only, and are not meant to be a limitation of the present invention. When β is equal to 1, the parametric equalizer 10 can be regarded as the peaking filter having a transfer function $H_1$ with a positive gain+12 dB (i.e.

the top frequency response curve shown in FIG. 5); and when β is equal to 0, the parametric equalizer 10 can be regarded as the notch filter having a transfer function $H_2$ with a negative gain −12 dB (i.e. the bottom frequency response curve shown in FIG. 5). In addition, all response curves are smooth in FIG. 5, which cause less signal variation and less power variation when the parametric equalizer 10 is used.

Figure 6:
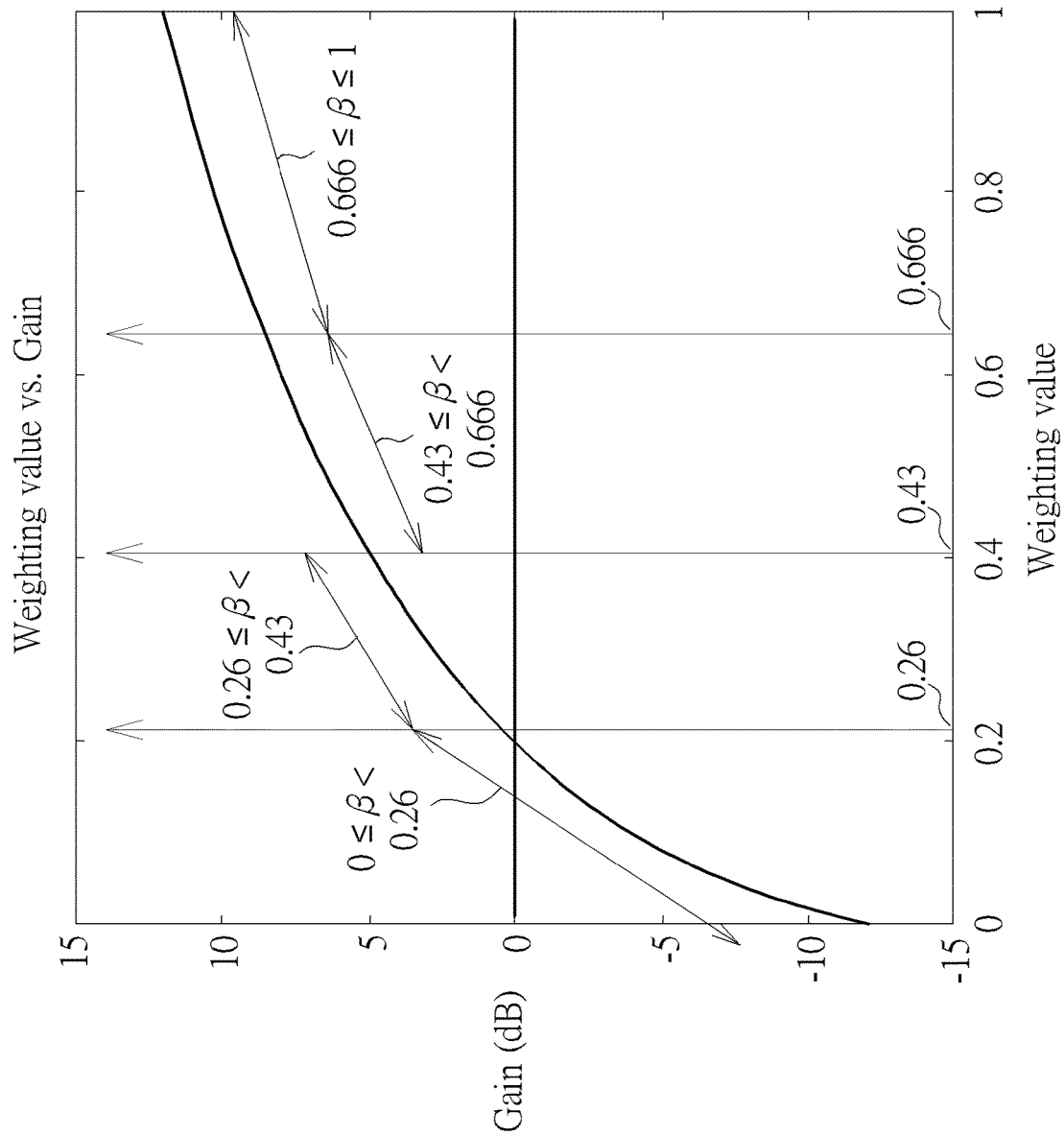
FIG. 6 is a diagram illustrating the relationship between a gain value reached by the parametric equalizer shown in FIG. 1 and a weighting value employed by the parametric equalizer shown in FIG. 1 according to another embodiment of the present invention.

FIG. 6 is a diagram illustrating the relationship between a gain value reached by the parametric equalizer 10 shown in FIG. 1 and a weighting value employed by the parametric equalizer 10 shown in FIG. 1 according to another embodiment of the present invention. Assume that the parametric equalizer circuit 12 and the parametric equalizer circuit 14 are configured as a peaking filter having a transfer function $H_1$ with a positive gain +12 dB and a quality factor $Q_P$, and a notch filter having a transfer function $H_2$ with a negative gain −12 dB and a quality factor $Q_N$, respectively, and the center frequency $1.2 \times 10^4$ Hz of the parametric equalizer circuit 12 is equal to the center frequency $1.2 \times 10^4$ Hz of the parametric equalizer circuit 14. By the above-mentioned weighting value combination of the transfer function $H_1$ and the transfer function $H_2$, any gain value between +12 dB to −12 dB can be reached for the parametric equalizer 10, wherein the ratio of the quality factor $Q_N$ to the quality factor $Q_P$ is a pre-defined constant (e.g. $Q_N=4Q_P$).

In the above-mentioned release control (or attack control), 4 fractions $$\frac{4}{2^{17}}, \frac{3}{2^{17}}, \frac{2}{2^{17}}, \frac{1}{2^{17}}$$

(or 4 fractions $$\left(\text{or 4 fractions } \frac{4}{2^{12}}, \frac{3}{2^{12}}, \frac{2}{2^{12}}, \frac{1}{2^{12}}\right)$$

) are used to set the release rate setting RR (or the attack rate setting AR) for slope adjustment in FIG. 6. In addition, 3 coefficients 0.666, 0.43, and 0.26 are used to categorize the weighting value (e.g. one of the first weighting value β and the second weighting value 1-β; for better comprehension, the first weighting value β). In this embodiment, four slope values are approximately obtained in four intervals (i.e. 0≤β<0.26, 0.26≤β<0.43, 0.43≤β<0.666, and 0.666≤β<1). Then, the numerators of the fractions are determined by magnitude of the four slope values. As shown in FIG. 6, by setting the numerators of the fractions of the release rate setting RR and the attack rate setting AR as 4 to 1 instead of all the same (e.g. all of the numerators of the fractions is 1), the curve representing the relationship between the gain values from +12 dB to −12 dB reached by the parametric equalizer 10 and the weighting value (e.g. the first weighting value can be smooth; as a result, the entire control range of the weighting value (e.g. the first weighting value has a relatively linear rate control. In addition, the control speed of the weighting value (e.g. the first weighting value can be made uniform.

Figure 7:
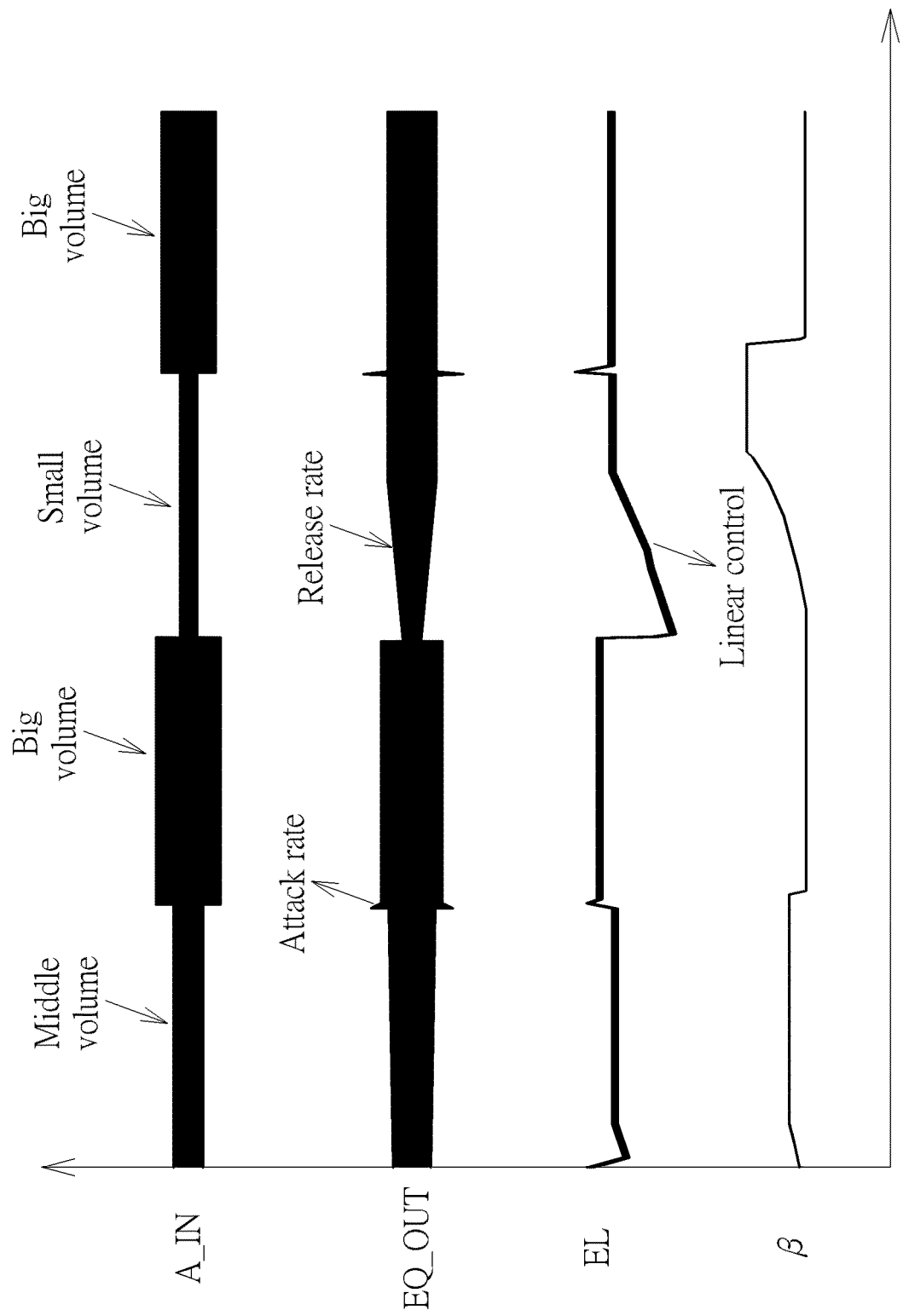
FIG. 7 is a diagram illustrating an input signal, an equalizer output signal, an energy level of the equalizer output signal, and a weighting value under a condition that the input signal is an in-band signal of the parametric equalizer shown in FIG. 1 according to an embodiment of the present invention.

FIG. 7 is a diagram illustrating the input signal A_IN, the equalizer output signal EQ_OUT, the energy level EL of the equalizer output signal EQ_OUT, and the first weighting value β under a condition that the input signal A_IN is an in-band signal of the parametric equalizer 10 shown in FIG. 1 according to an embodiment of the present invention. In this embodiment, the frequency of the input signal A_IN is 200 Hz, and the center frequency of the parametric equalizer 10 is also 200 Hz. As a result, the input signal A_IN is inside the band of the parametric equalizer 10. As shown in FIG. 7, the parametric equalizer 10 can generate the equalizer output signal EQ_OUT by controlling the weighting value (e.g. one of the first weighting value β and the second weighting value 1-β, for better comprehension, the first weighting value with slope adjustment. The equalizer output signal EQ_OUT can be released by the release control when the energy level EL of the equalizer output signal EQ_OUT is smaller than the threshold value TH, or can be suppressed by the attack control when the energy level EL of the equalizer output signal EQ_OUT is not smaller than the threshold value TH.

Figure 8:
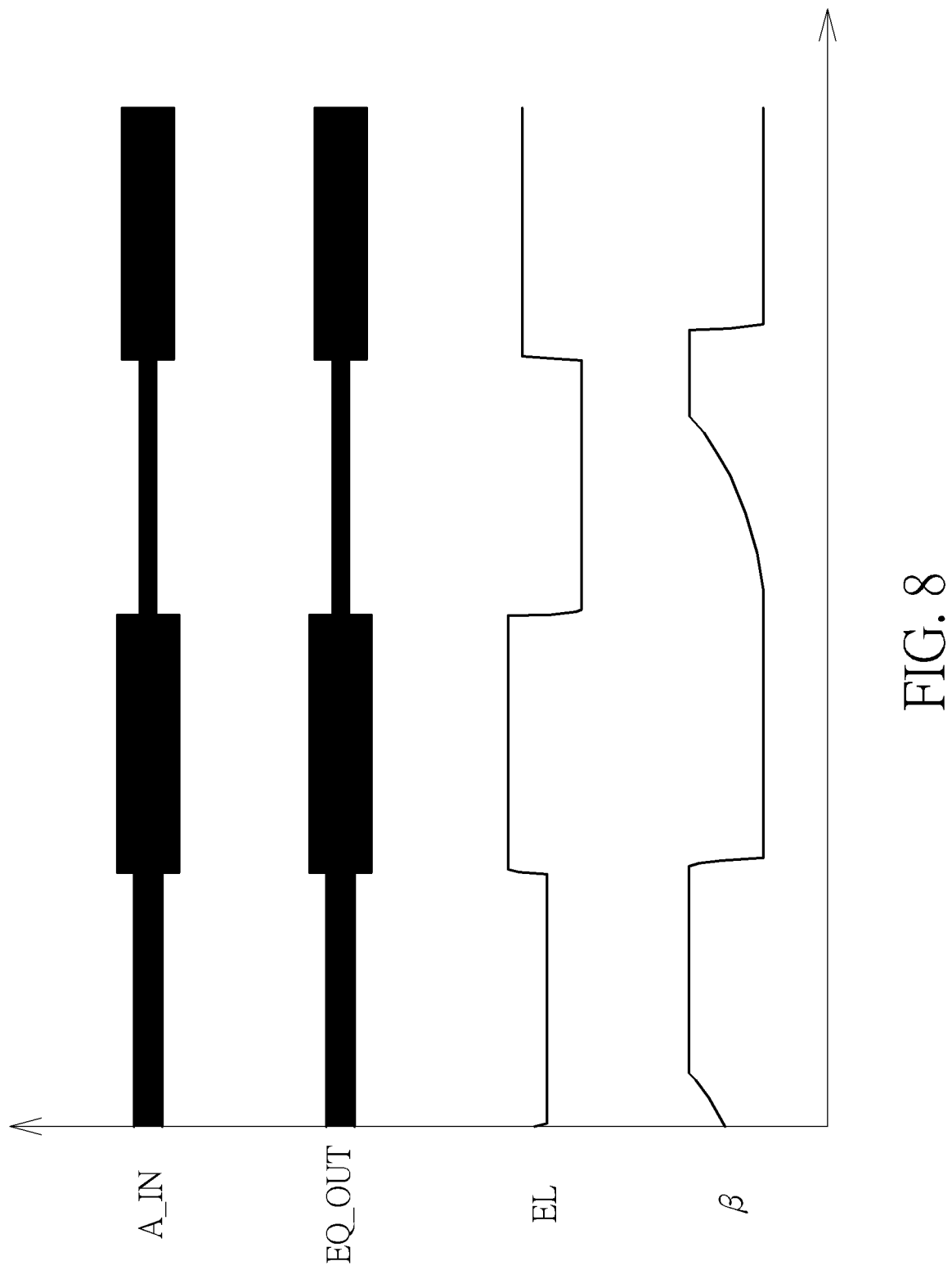
FIG. 8 is a diagram illustrating an input signal, an equalizer output signal, an energy level of the equalizer output signal, and a weighting value under a condition that the input signal is an out-of-band signal of the parametric equalizer shown in FIG. 1 according to another embodiment of the present invention.

FIG. 8 is a diagram illustrating the input signal A_IN, the equalizer output signal EQ_OUT, the energy level EL of the equalizer output signal EQ_OUT, and the first weighting value β under a condition that the input signal A_IN is an out-of-band signal of the parametric equalizer 10 shown in FIG. 1 according to another embodiment of the present invention. In this embodiment, the frequency of the input signal A_IN is 5000 Hz, and the center frequency of the parametric equalizer 10 is 200 Hz. As a result, the input signal A_IN is out of the band of the parametric equalizer 10. As shown in FIG. 8, although the parametric equalizer 10 can generate the equalizer output signal EQ_OUT by controlling the weighting value (e.g. one of the first weighting value β and the second weighting value 1-β; for better comprehension, the first weighting value β) with slope adjustment, the equalizer output signal EQ_OUT is identical to the input signal A_IN. Therefore, when the input signal A_IN is out of the band of the parametric equalizer 10, the parametric equalizer 10 does not work on the input signal A_IN.

Figure 9:
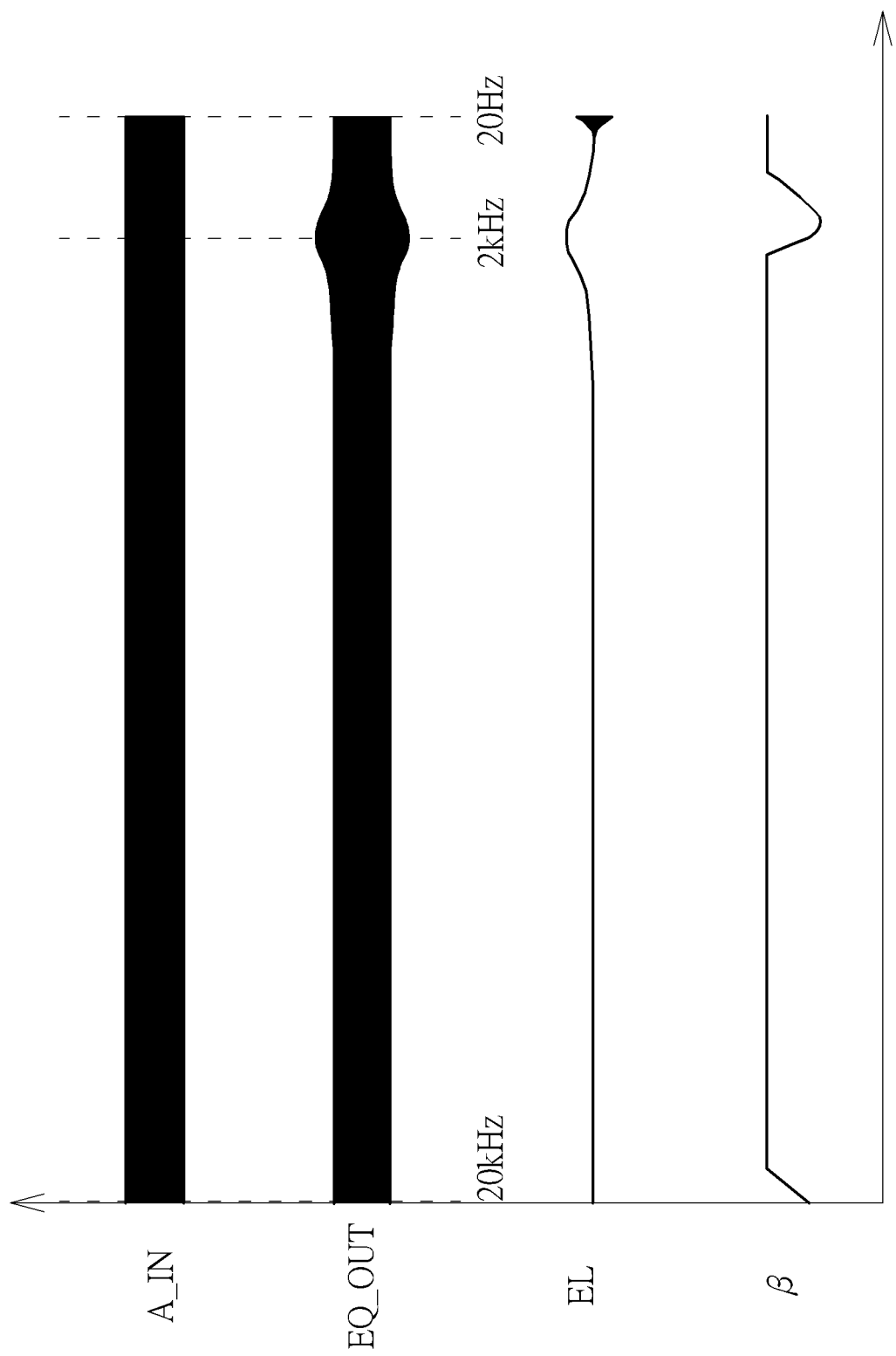
FIG. 9 is a diagram illustrating the parametric equalizer shown in FIG. 1 working on sweep frequency according to an embodiment of the present invention.

FIG. 9 is a diagram illustrating the parametric equalizer 10 shown in FIG. 1 working on sweep frequency according to an embodiment of the present invention. The frequencies are swept from 20 kHz to 20 Hz, and the center frequency of the parametric equalizer 10 is 2 kHz. As shown in FIG. 9, the parametric equalizer 10 only works on 2 kHz.

Figure 10:
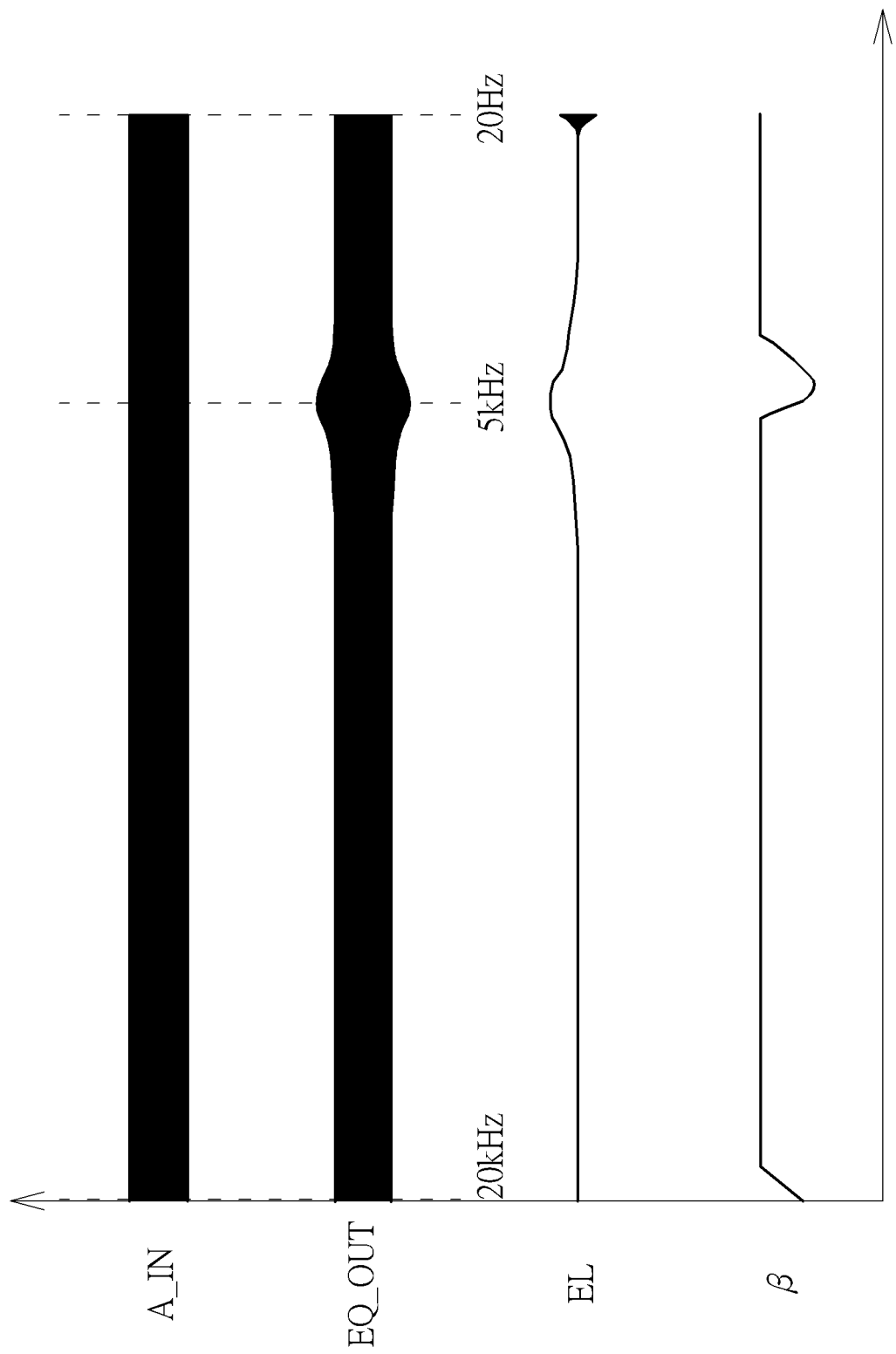
FIG. 10 is a diagram illustrating the parametric equalizer shown in FIG. 1 working on sweep frequency according to another embodiment of the present invention.

FIG. 10 is a diagram illustrating the parametric equalizer 10 shown in FIG. 1 working on sweep frequency according to another embodiment of the present invention. The frequencies are swept from 20 kHz to 20 Hz, and the center frequency of the parametric equalizer 10 is 5 kHz. As shown in FIG. 10, the parametric equalizer 10 only works on 5 kHz.

Figure 11:
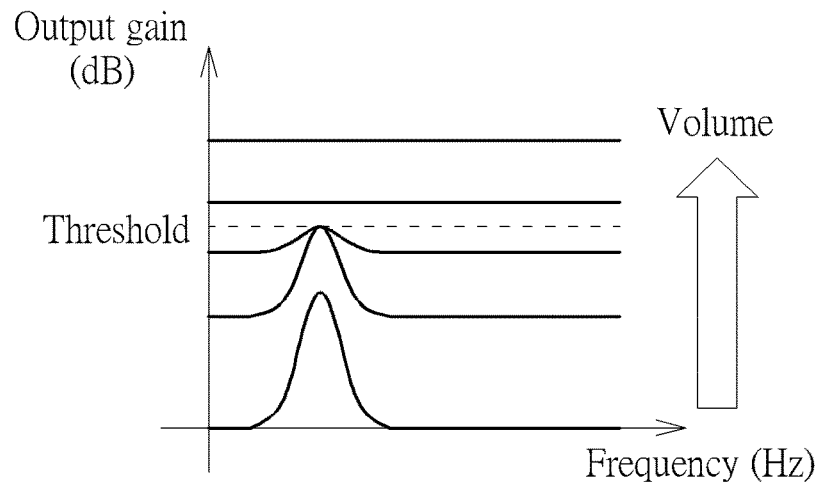
FIG. 11 is a diagram illustrating an output frequency response of a type I adjustment of an input signal after using the method of the present invention.
Figure 12:
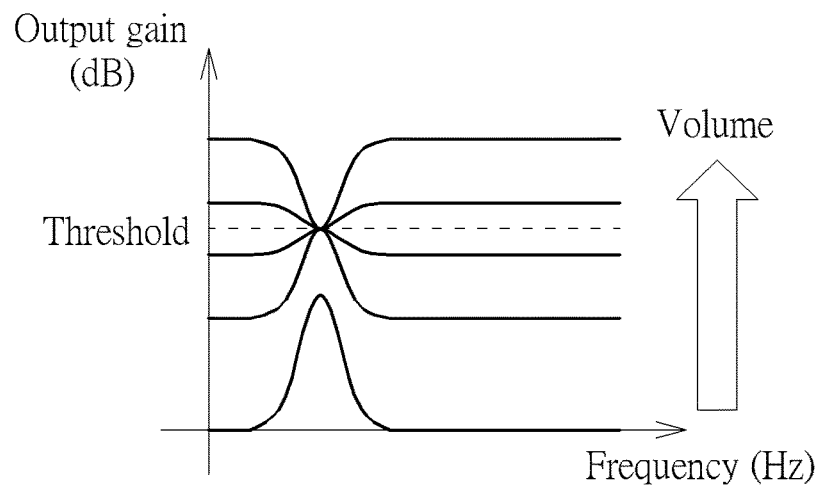
FIG. 12 is a diagram illustrating an output frequency response of a type II adjustment of an input signal after using the method of the present invention.

Back to FIG. 3, the method for dynamically adjusting weighting values to equalize an input signal A_IN provided by the present invention may achieve two effects: type I adjustment and type II adjustment. FIG. 11 is a diagram illustrating an output frequency response of a type I adjustment of an input signal after using the method of the present invention. FIG. 12 is a diagram illustrating an output frequency response of a type II adjustment of an input signal after using the method of the present invention.

Please refer to FIG. 11. The embodiment of the type I adjustment may be referred to FIG. 2 and FIG. 3. In the type I adjustment, when the energy level EL is larger than the threshold value TH, the β value is set not to be less than 0.1432. In addition, when the β value is equal to 0.1432, the output gain is equal to 0 dB. As a result, in the type I adjustment, when the input level is larger than a predetermined threshold value (labeled as "Threshold" in FIG. 11), the output gain is unchanged at a specific frequency (e.g. a center frequency of the parametric equalizer of the present invention).

Please refer to FIG. 12. The embodiment of the type II adjustment may be referred to FIG. 2 and FIG. 3. In the type II adjustment, when the energy level EL is larger than the threshold value TH, the β value is set to 0. As a result, in the type II adjustment, when the input level is larger than a predetermined threshold value (labeled as "Threshold" in FIG. 12), the output gain may be attenuated at a specific frequency (e.g. a center frequency of the parametric equalizer of the present invention), to further avoid clipping of the signal.

Figure 13:
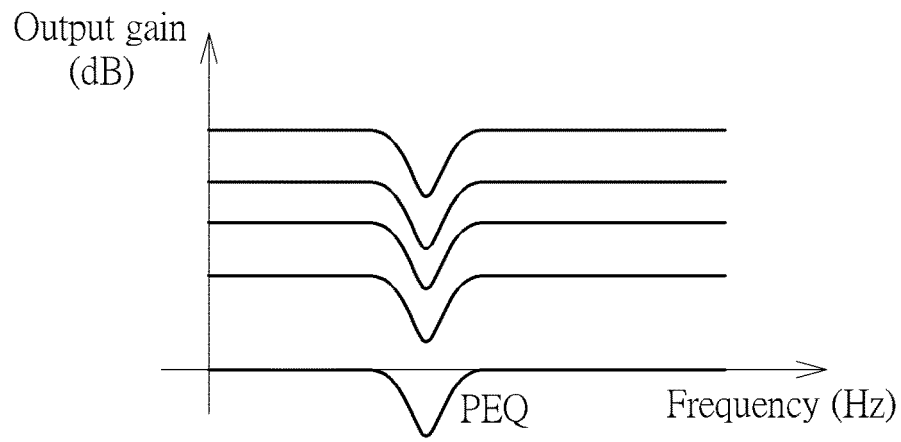
FIG. 13 is a diagram illustrating an output frequency response when using a parametric equalizer of the prior art.

FIG. 13 is a diagram illustrating an output frequency response when using a parametric equalizer of the prior art. As shown in FIG. 13, the parametric equalizer (labeled as "PEQ") of the prior art has fixed gain attenuation regardless of magnitude of the input/output signal. Compared with the parametric of the prior art, the parametric equalizer of the present invention has many variations that may change the output response at a specific frequency (e.g. a center frequency of the parametric equalizer of the present invention).

Figure 14:
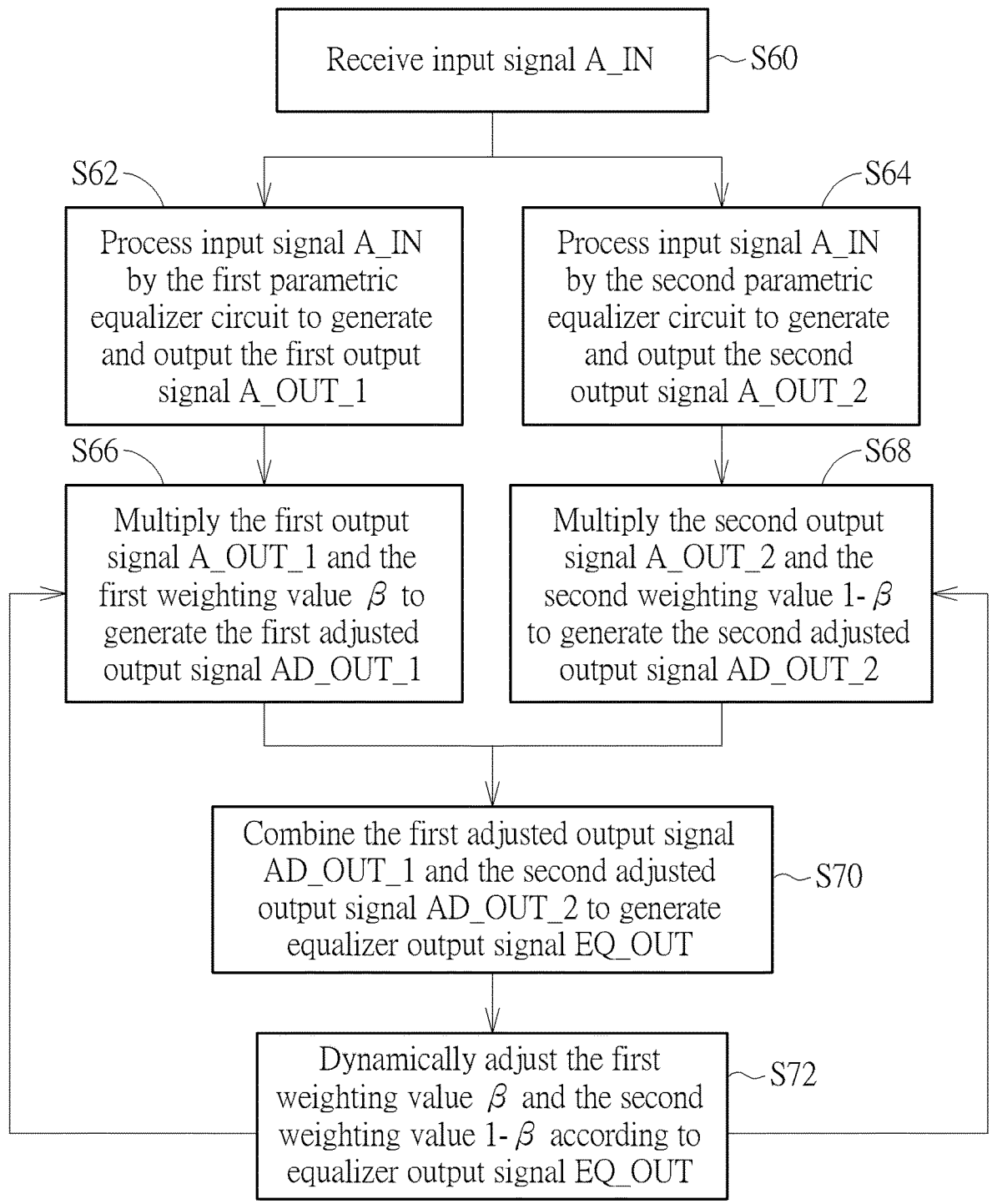
FIG. 14 is a flow chart illustrating a method for dynamically adjusting weighting values to equalize an input signal according to an embodiment of the present invention.

FIG. 14 is a flow chart illustrating a method for dynamically adjusting weighting values to equalize an input signal A_IN according to an embodiment of the present invention. Provided that the result is substantially the same, the steps are not required to be executed in the exact order shown in FIG. 14. For example, the method shown in FIG. 14 may be employed by the parametric equalizer 10 shown in FIG. 1.

In Step S60, the input signal A_IN is received by the parametric equalizer.

In Step S62, the input signal A_IN is processed by the first parametric equalizer circuit to generate and output the first output signal A_OUT_1.

In Step S64, the input signal A_IN is processed by the second parametric equalizer circuit to generate and output the second output signal A_OUT_2.

In Step S66, the first output signal A_OUT_1 and the first weighting value β are multiplied to generate the first adjusted output signal AD_OUT_1.

In Step S68, the second output signal A_OUT_2 and the second weighting value 1-β are multiplied to generate the second adjusted output signal AD_OUT_2.

In Step S70, the first adjusted output signal AD_OUT_1 and the second adjusted output signal AD_OUT_2 are combined to generate the equalizer output signal EQ_OUT.

In Step S72, the first weighting value β and the second weighting value 1-β are dynamically adjusted according to the equalizer output signal EQ_OUT.

Since a person skilled in the pertinent art can readily understand details of the steps after reading above paragraphs directed to the parametric equalizer 10 shown in FIG. 1, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A parametric equalizer, comprising:
    a first parametric equalizer circuit, having a first transfer function with a positive gain, and arranged to process an input signal according to the first transfer function and output a first output signal by processing the input signal;
    a second parametric equalizer circuit, having a second transfer function with a negative gain, and arranged to process the input signal according to the second transfer function and output a second output signal by processing the input signal;
    a first multiplication circuit, coupled to the first parametric equalizer circuit, and arranged to multiply the first output signal and a first weighting value to generate a first adjusted output signal;
    a second multiplication circuit, coupled to the second parametric equalizer circuit, and arranged to multiply the second output signal and a second weighting value to generate a second adjusted output signal;
    an addition circuit, coupled to the first multiplication circuit and the second multiplication circuit, and arranged to combine the first adjusted output signal and the second adjusted output signal to generate an equalizer output signal; and
    a weighting control circuit, coupled to the first multiplication circuit, the second multiplication circuit, and the addition circuit, and arranged to dynamically adjust the first weighting value and the second weighting value according to the equalizer output signal.

2. The parametric equalizer of claim 1, wherein the first parametric equalizer circuit is a peaking filter embodied by a biquad filter.

3. The parametric equalizer of claim 1, wherein the second parametric equalizer circuit is a notch filter embodied by a biquad filter.

4. The parametric equalizer of claim 1, wherein a sum of the first weighting value and the second weighting value is equal to one.

5. The parametric equalizer of claim 1, wherein the weighting control circuit comprises:
    an energy detection circuit, arranged to measure an energy level of the equalizer output signal; and
    a weighting value generator, coupled to the energy detection circuit, and arranged to dynamically adjust the first weighting value and the second weighting value according to the energy level of the equalizer output signal.

6. The parametric equalizer of claim 5, wherein the energy detection circuit comprises:
    an absolute circuit, arranged to generate an absolute value of the equalizer output signal; and
    an alpha filter, coupled to the absolute circuit and the weighting value generator, and arranged to generate the energy level according to an output of the absolute circuit.

7. The parametric equalizer of claim 5, wherein the weighting value generator is further arranged to receive an attack rate setting and a release rate setting; when the energy level of the equalizer output signal is smaller than a threshold value, the weighting value generator controls one of the first weighting value and the second weighting value according to slope adjustment specified by the release rate setting; and when the energy level of the equalizer output signal is not smaller than the threshold value, the weighting value generator controls said one of the first weighting value and the second weighting value according to slope adjustment specified by the attack rate setting.

8. The parametric equalizer of claim 7, wherein the release rate setting comprises a plurality of fractions, and power terms of denominators of the plurality of fractions control a release rate applied by the release rate setting.

9. The parametric equalizer of claim 7, wherein the attack rate setting comprises a plurality of fractions, and power terms of denominators of the plurality of fractions control an attack rate applied by the attack rate setting.

10. The parametric equalizer of claim 7, wherein the weighting value generator is further arranged to receive a reference threshold value, and obtains the threshold value by multiplying the reference threshold and a pre-determined coefficient.

11. The parametric equalizer of claim 1, wherein the parametric equalizer has a first adjustment mode and a second adjustment mode; in the first adjustment mode, when a level of the input signal is larger than a threshold value, a gain of the equalizer output signal is unchanged; and in the second adjustment mode, when the level of the input signal is larger than the threshold value, the gain of the equalizer output signal is attenuated.

12. The parametric equalizer of claim 1, wherein when the input signal is an out-of-band signal of the parametric equalizer, the equalizer output signal is identical to the input signal.

13. The parametric equalizer of claim 1, wherein the first transfer function further comprises a first quality factor, the second transfer function further comprises a second quality factor, and a ratio of the second quality factor to the first quality factor is a pre-defined constant.

14. A method for equalizing an input signal to generate an equalizer output signal, comprising:
processing, by a first parametric equalizer circuit having a first transfer function with a positive gain, the input signal to generate and output a first output signal;
processing, by a second parametric equalizer circuit having a second transfer function with a negative gain, the input signal to generate and output a second output signal;
multiplying the first output signal and a first weighting value to generate a first adjusted output signal;
multiplying the second output signal and a second weighting value to generate a second adjusted output signal;
combining the first adjusted output signal and the second adjusted output signal to generate the equalizer output signal; and
dynamically adjusting the first weighting value and the second weighting value according to the equalizer output signal.

15. The method of claim 14, wherein the first parametric equalizer circuit is a peaking filter embodied by a biquad filter.

16. The method of claim 14, wherein the second parametric equalizer circuit is a notch filter embodied by a biquad filter.

17. The method of claim 14, wherein a sum of the first weighting value and the second weighting value is equal to one.

18. The method of claim 14, wherein dynamically adjusting the first weighting value and the second weighting value according to the equalizer output signal comprises:
measuring an energy level of the equalizer output signal; and
dynamically adjusting the first weighting value and the second weighting value according to the energy level of the equalizer output signal.

19. The method of claim 18, wherein measuring the energy level of the equalizer output signal comprises:
performing absolute value computation upon the equalizer output signal to generate an absolute value computation result; and
generating the energy level according to the absolute value computation result.

20. The method of claim 18, wherein dynamically adjusting the first weighting value and the second weighting value according to the energy level of the equalizer output signal comprises:
receiving an attack rate setting and a release rate setting;
when the energy level of the equalizer output signal is smaller than a threshold value, controlling one of the first weighting value and the second weighting value according to slope adjustment specified by the release rate setting;
when the energy level of the equalizer output signal is not smaller than the threshold value, controlling said one of the first weighting value and the second weighting value according to slope adjustment specified by the attack rate setting.

21. The method of claim 20, wherein the release rate setting comprises a plurality of fractions, and power terms of denominators of the plurality of fractions control a release rate applied by the release rate setting.

22. The method of claim 20, wherein the attack rate setting comprises a plurality of fractions, and power terms of denominators of the plurality of fractions control an attack rate applied by the attack rate setting.

23. The method of claim 20, wherein dynamically adjusting the first weighting value and the second weighting value according to the energy level of the equalizer output signal further comprises:
receiving a reference threshold value; and
obtaining the threshold value by multiplying the reference threshold and a pre-determined coefficient.

24. The method of claim 14, wherein the parametric equalizer has a first adjustment mode and a second adjustment mode; in the first adjustment mode, in response to a level of the input signal being larger than a threshold value, the method makes a gain of the equalizer output signal unchanged; and in the second adjustment mode, in response to the level of the input signal being larger than the threshold value, the method attenuates the gain of the equalizer output signal.

25. The method of claim 14, wherein in response to the input signal being an out-of-band signal, the method generates the equalizer output signal that is identical to the input signal.

26. The method of claim 14, wherein the first transfer function further comprises a first quality factor, the second transfer function further comprises a second quality factor, and a ratio of the second quality factor to the first quality factor is a pre-defined constant.

* * * * *